United States Patent [19]
Itozaki et al.

[11] Patent Number: 5,478,800
[45] Date of Patent: Dec. 26, 1995

[54] PROCESS FOR PREPARING A SUPERCONDUCTING THIN FILM

[75] Inventors: Hideo Itozaki; Nobuhiko Fujita, both of Itami; Kengo Okura, Osaka, all of Japan

[73] Assignee: Sumitomo Electric Industries, Ltd., Osaka, Japan

[21] Appl. No.: 348,884

[22] Filed: Nov. 28, 1994

Related U.S. Application Data

[63] Continuation of Ser. No. 275,649, Jul. 15, 1994, abandoned, which is a continuation of Ser. No. 173,927, Dec. 28, 1993, abandoned, which is a continuation of Ser. No. 58,807, May 10, 1993, abandoned, which is a continuation of Ser. No. 861,331, Mar. 25, 1992, abandoned, which is a continuation of Ser. No. 732,358, Jul. 18, 1991, abandoned, which is a continuation of Ser. No. 603,258, Oct. 26, 1990, abandoned, which is a continuation of Ser. No. 152,714, Feb. 5, 1988, abandoned.

[30] Foreign Application Priority Data

Feb. 5, 1987 [JP] Japan ................................. 62-25222
Feb. 17, 1987 [JP] Japan ................................. 62-33774

[51] Int. Cl.$^6$ ........................... H01L 39/24; C23C 14/34
[52] U.S. Cl. .................... 505/475; 204/192.24; 505/476; 505/731
[58] Field of Search ...................... 204/192.24; 505/475, 505/476 731

[56] References Cited

U.S. PATENT DOCUMENTS

| | | | |
|---|---|---|---|
| 3,932,315 | 1/1976 | Sleight | 252/518 |
| 4,316,785 | 2/1982 | Suzuki et al. | 204/192.24 |

FOREIGN PATENT DOCUMENTS

| | | | |
|---|---|---|---|
| 0280273 | 8/1988 | European Pat. Off. | 204/192.29 |
| 0284489 | 9/1988 | European Pat. Off. | 204/192.29 |
| 2469005 | 5/1981 | France | 204/192.29 |
| 3715623A1 | 11/1988 | Germany | 204/192.29 |
| 56-109824 | 8/1981 | Japan | 204/192.24 |
| 60-96599 | 5/1985 | Japan | 204/192.24 |

OTHER PUBLICATIONS

Bednorz, et al, "Possible High Tc Superconductivity in the Ba–La–Cu–O System", *Z. Phys. B.–Condensed Matter* vol. 64 (1986) pp. 189–193.

M. Kawasaki et al, *Jap. J. Appl. Phys.*, vol. 26, May 1987, pp. L738–L740.

H. Adachi et al. *Jap. J. Appl. Phys.*, vol. 26, May 1987, pp L709–L710.

*VLSI Technology*, McGraw Hill Book Co. edited by S. M. Sze, 1983, p. 358.

*Handbook of Thin Film Technology*, edited by Leon I. Maissel and Reinhard Glang, McGraw–Hill Pub. Co. 1970, pp. 4–15 and 4–16.

Physical Review Letters, vol. 58, No. 4, 26 Jan. 1987, pp. 405–407, The American Physical Socieity: C. W. Chu et al.:

(List continued on next page.)

*Primary Examiner*—Aaron Weisstuch
*Attorney, Agent, or Firm*—Foley & Lardner

[57] ABSTRACT

A process for preparing a superconducting thin film of $K_2NiF_4$-type oxides such as [ La, Ba ]$_2CuO_4$, or [ La, Sr ]$_2CuO$ having higher transition temperature of superconductivity which can be used for Josephson Junctions devices or the like by sputtering technique.

The process of the present invention is characterized in that the target used in the sputtering technique is composed of a mixture of compounds which contain at least La, one element M selected from a group of Ia, IIa and IIIa elements of the Periodic Table, and Cu. The compounds may be oxides, carbonates, nitrate or sulfates of La, said element M, and Cu. Said mixture which is used as the target is preferably sintered into a form of a sintered body. The substrate on which the thin film is deposited is preferably heated at a temperature between 100 and 1,200° C. during sputtering and the deposited thin film is preferably heat-treated at a temperature between 600° and 1,200° C. after the sputtering is completed.

9 Claims, 4 Drawing Sheets

OTHER PUBLICATIONS

"Evidence for superconductivity above 40 K in the La–Ba–Cu–O compound system".
Pysical Review Letters, vol. 58, No. 4, 26 Jan. 87, pp. 408–410, The American Physical Society: R. J. Cava et al.

"Bulk superconductivity at 36 K in La1.8SrO.2CuO4".

Japanese Journal of Applied Physics, vol. 26, No. 4, Apr. 1987, pp. L410–L412; S. Nagata et al.: "High Tc thin films of (La1–xMx)yCuO4–delta (M=Sr, Ba, Ca) prepared by sputtering".

PROCESS FOR PREPARING A SUPERCONDUCTING THIN FILM

This application is a continuation of application Ser. No. 08/275,649, filed Jul. 15, 1994, now abandoned, which is a continuation of Ser. No. 08/173,927, filed Dec. 28, 1993, now abandoned which is a continuation of application Ser. No. 08/058,807, filed May 10, 1993, now abandoned, which is a continuation of application Ser. No. 07/861,331, filed Mar. 25, 1992, now abandoned which is a continuation of application Ser. No. 07/732,358, filed Jul. 18, 1991, now abandoned which is a continuation of application Ser. No. 07/603,258, filed Oct. 26, 1990, now abandoned which is a continuation of application Ser. No. 07/152,714, filed Feb. 5, 1988, all of which are now abandoned.

BACKGROUND OF THE INVENTION

1. Field of the Invention

The present invention relates to a process for preparing a thin film of superconductor. More particularly, it relates to a process for depositing on a substrate a superconducting thin film of a compound oxide having a higher transition temperature of superconductivity which can be used for Josephson Junctions devices or the like.

More particularly, the present invention relates to a process for depositing a superconducting thin film of $K_2NiF_4$-type oxides such as $[La, Ba]_2CuO_4$, $[La, Sr]_2CuO$ or the like.

2. Description of the Related Art

Superconductivity is a phenomenon in which the electrical resistance becomes zero and hence can be utilized to realize a variety of devices and apparatus which are required to reduce consumption of electrical energy and several ideas of its applications which utilize the phenomenon of superconductivity have been proposed. However, their actual usage have been restricted because the phenomenon of superconductivity can be observed only at very low cryogenic temperatures. Among known superconducting materials, a group of materials having so-called A-15 structure show rather higher Tc (critical temperature of superconductivity) than others, but even the highest recorded Tc in the case of $Nb_3Ge$ did not exceed 23.2 K.

It is clear that liquefied helium (boiling point of 4.2 K) is the only known cryogen which can realize the very low temperature of Tc. However, helium is not only a limited and costly resource, but also requires a large-scaled system for liquefaction. Therefore, other superconducting materials having a higher Tc had been desired. However, no material which exceeded the abovementioned Tc had been found during all of the studies conducted for the past ten years.

The possibility of the existence of a new type of superconducting materials having much higher Tc was revealed by Bednorz and Muller, who discovered a new oxide type superconductor in 1986 (Z. Phys. B64 (1986) 189).

These new oxide type superconducting materials are $[La, Ba]_2CuO_4$ and $[La, Sr]_2CuO_4$, which are referred to as the $K_2NiF_4$-type oxides having a crystal structure similar to Perovskite-type superconducting oxides which have been known (See for example, U.S. Pat. No. 3,932,315). The $K_2NiF_4$-type oxides show such higher Tc as high as 30 k which are much higher than the known superconducting materials and hence it became possible to use liquified hydrogen (b.p.= 20.4 K) or liquified neon (b.p.= 27.3 K) as a cryogen which causes them to exhibit superconductivity characteristics. Particularly, hydrogen is an inexhaustable resource with the adverse drawback of including a danger of explosion.

Conventional methods for producing superconducting compounds or metal alloys may be classified into two categories: (a) the powder sintering technique in which starting materials are blended into a mixture which is then sintered, and (b) the vapor deposition technique in which an alloy or a compound is vaporized into the gaseous phase and deposited or grown on a substrate.

FIG. 3 shows a series of operations in the typical powder abovementioned sintering process which includes the following steps:

(1) uniformly mixing powders having a particle size of several μm such as $BaCO_3$, $La_2CO_3$ or $SrCO_3$, and CuO, (2) molding the powders in a mold, (3) performing preliminary sintering of the molded material at 900° C. for 12 hours, (4) removing the sintered article from the mold and then pulverizing the same again, (5) press-molding the pulverized power, and (6) sintering (reaction-sintering) the press-molded material at 1,100° C. for 2 hours.

The vapor deposition technique has been used for producing a thin film of superconducting material such as $Nb_3Ge$ and $BaPb_{1-x}Bi_xO_3$. In the case of $Nb_3Ge$, particles of Nb and Ge are sputtered from several targets each consisting of Nb and Ge, irrespectively, and are deposited onto a substrate to form a film composed of $Nb_3Ge$. Japanese patent laid-open No. 56-109,824 discloses a process for producing a thin film of $BaPb_{1-x}Bi_xO_3$ by means of a sputtering technique.

However, the above mentioned new type superconducting materials of $K_2NiF_4$-type oxides which have just been discovered have been studied and developed only in the form of sintered bodies or as a bulk produced from powders which have been previously press-molded. In other words, heretofore, no studies of film-deposition techniques have been conducted on these new type superconductors. Therefore, the resultant superconducting bodies must have a bulk form which is difficult to be utilized in the form of a thin film which is required in the field of electrical devices or elements.

Therefore, an object of the present invention is to provide a process which can change the $K_2NiF_4$-type superconducting oxides into a thin film form.

SUMMARY OF THE INVENTION

The subject of the present invention resides in a process for preparing a superconducting thin film composed of a compound oxide of La, an element M selected from a group of Ia, IIa and IIIa elements in the Periodic Table and Cu by a sputtering technique, characterized in that the target used in the sputtering technique is composed of a mixture of compounds each containing at least La, said element M, and Cu.

The proportions or atom ratios of La, said element M, and Cu in the compounds for the target are preferably adjusted in such manner that the resulting thin film of compound oxide of La, said element M and Cu has a composition of

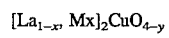

in which, M is an element selected from a group comprising elements of the Ia, IIa and IIIa groups of the Periodic Table, $0<x<1$ and $0 \leq y<4$.

The element M may be preferably selected from Ba or Sr.

It is also preferable that the substrate on which the thin film is deposited is heated to a temperature between 100° and 1,200° C. during sputtering operation.

The substrate may be selected from any materials which are known and used in the field of the sputtering technique, such as a single crystal of magnesia, strontium titanate, beryllia, alumina, silicon, yttrium stabilized zirconia (YSZ) or the like.

It is also preferable that, after the sputtering is completed, the deposited thin film is heat-treated at a temperature between 600° and 1,200° C.

Now, an apparatus which can be used to realize the abovementioned process according to the present invention will be described with reference to attached drawings which are not limitative of the present invention.

Figure 1:
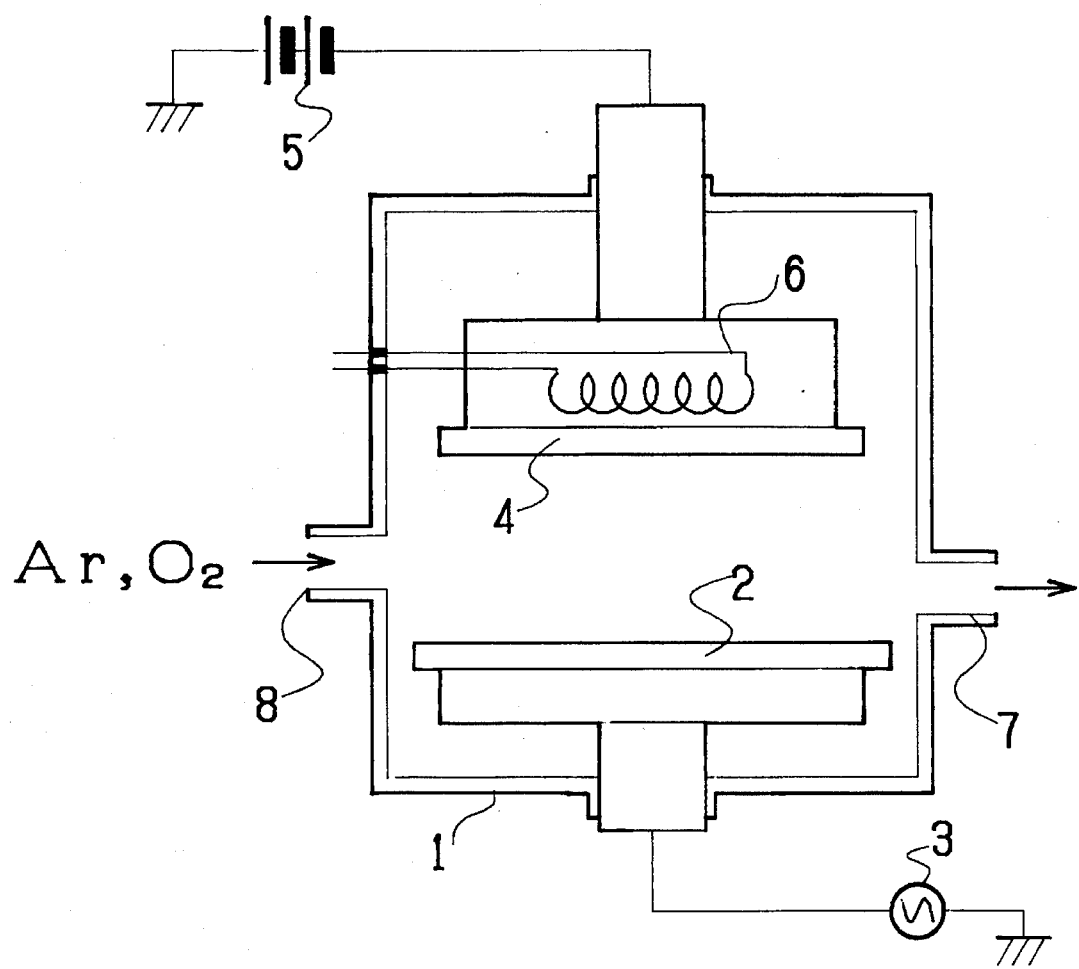
FIG. 1 illustrates an example of a sputtering apparatus which is used to carry out the process of the present invention.

The apparatus illustrated in FIG. 1 shows a sputtering device including a sputtering material target 2 enclosed in a vacuum chamber or bell jar 1 and a substrate 4 on which the thin film is deposited facing the target 2. A vacuum pump (not shown) communicated through a port 7 with the interior of the chamber 1 functions to create vacuum therein. The target is impressed with high-frequency electrical power from a high-frequency power source 3.

Bias voltage is impressed on the substrate 4 from a source of high-voltage 5. The substrate 4 is heated by a heater 6 so that the temperature of the substrate is adjustable. The bell jar 1 has a gas inlet 8 for introducing argon gas and oxygen gas.

In operation, the target 2 is sputtered by Ar ions in the presence of oxygen whose content or proportion is adjusted so that additional oxygen is supplied to the thin film which will be deposited on the substrate 4 to produce a desired oxide.

DESCRIPTION OF THE PREFERRED EMBODIMENTS

In a preferable embodiment according to the present invention, the target is in the form of a sintered body. Namely, the target used in sputtering is made of a sintered body which is produced by sintering a powder mixture of the above-mentioned compounds each containing at least one of La, said element M, and Cu.

In this case, it is preferable to use a target of a sintered body which is made from a mixture of the compounds wherein the proportions or atom ratios of La, said element M, and Cu in the mixture are adjusted in such a manner that the resulting thin film of compound oxide of La, said element M, and Cu has a composition of

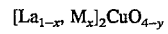

in which, M is an element selected from a group comprising elements of the Ia, IIa and IIIa groups of the Periodic Table, and $0<x<1$ and $0 \leq y<4$.

When Ba is used as the element M, the value of the x in the abovementioned composition is preferably selected in the range of $0.025 \leq x \leq 0.12$, while when Sr is used as the element M, the value of the x in the abovementioned composition is preferably selected in the range of $0.09 \leq x \leq 0.25$.

The compounds may be selected from a group comprising oxides of La, said element M, and Cu, carbonates of the same, nitrates or sulfates of the same.

In an embodiment of the present invention, said mixture of compounds may be a powder mixture of $La_2CO_3$, $BaCO_3$ or $SrCO_3$, and CuO. In this case, said powder mixture is preferably a powder mixture composed of 70 to 95% by weight of $La_2CO_3$, 1 to 20% by weight of $BaCO_3$ or $SrCo_3$, and 1 to 30% by weight of CuO.

It is preferable that the sintering operation is carried out in a powder hot-press or in a hot isostatic press (HIP).

The sputtering is preferably operated under the presence of oxygen gas. The partial pressure of oxygen gas is preferably adjusted to a range between $10^{-6}$ and $10^{-2}$ Torr. It is also preferable that the substrate on which the thin film is deposited is heated to a temperature between 100° and 1,200° C. during sputtering.

It is also preferable that a bias voltage of 10 to 1,500 V is impressed onto said substrate during sputtering operation.

Another preferable feature of the present invention resides in that, after the sputtering operation is completed, the deposited thin film is heat-treated at a temperature between 600° and 1,200° C.

The structure of the resulting thin film can be proved to be a crystalline film having $K_2NiF_4$-type layered perovskite structure by electron probe microanalysis (EPMA) or X-ray diffraction.

According to a preferred embodiment of the present invention, the process for preparing a superconducting thin film composed of a compound oxide of La, one element M selected from a group of Ia, IIa and IIIa elements in the Periodic Table, and Cu by a sputtering technique is characterized in that a target of a sintered body which is made from a mixture of the compounds wherein the proportions or atom ratios of La, said element M, and Cu in the mixture are adjusted in such a manner that the resulting thin film of compound oxide of La, said element M, and Cu has a composition of

in which, M is an element selected from a group comprising elements of the Ia, IIa and IIIa groups of the Periodic Table, $0<x<1$ and $0 \leq y \leq 4$, and in that, after the sputtering complete, the deposited thin film is heat-treated at a temperature between 600° and 1,200° C. in air.

According to another preferred embodiment of the present invention, the process for preparing a superconducting thin film composed of a compound oxide of La, one element M selected from a group of Ia, IIa and IIIa elements in the Periodic Table, and Cu by a sputtering technique, is characterized in that a target of a sintered body which is made from a mixture of the compounds wherein the proportions or atom ratios of La, said element M, and Cu in the mixture are adjusted in such a manner that the resulting thin,film of compound oxide of La, said element M, and Cu has a composition of $[La_{1-x}, M_x]_2CuO_{4-y}$ in which, M is an element selected from a group comprising elements of the Ia, IIa and IIIa groups of the Periodic Table, $0<x<1$ and $0 \leq y<4$, in that the substrate on which the thin film is deposited is heated to a temperature between 100° and 1,200° C. during sputtering operation, and in that, after the sputtering is completed, the deposited thin film is heat-treated at a temperature between 600° and 1,200° C. in air.

During the sputtering operation, argon gas contained in the vacuum chamber is ionized into $Ar^+$ and is accelerated so that the $Ar^+$ ions strike the target composed of the material to be deposited as a film, resulting in that particles sputtered out of the target are deposited on the substrate in a form of a thin film. When the target is made of a compound oxide made from $La_2O_3$, $SrCo_3$, and CuO or the like, particles of each of the oxides are sputtered. If, at this stage of the sputtering process, oxygen gas is introduced into the vacuum chamber, a thin film of $[La_{1-x}, Ba_x]_2CuO_{4-y}$ or $[La_{1-x}, Sr_x]_2CuO_{4-y}$ which is the most stable compound is deposited on the substrate.

The composition of the thin film deposited on the substrate depends on the composition of material of the target. The present invention is based on such finding of the present inventors. Thus, if the atom ratios of La, said element M, Cu, and oxygen in the target are adjusted in such manner that the resulting thin film of compound oxide of La, said element M, and Cu has a composition of $[La_{1-x}, M_x]_2CuO_{4-y}$, (wherein M is an element selected from a group comprising elements from the Ia, IIa and IIIa groups of the Periodic Table, $0<x<1$ and $0 \leq y<4$), a thin film of superconductor having high-Tc can be produced In other words, thin films of superconductors having high-Tc and having $K_2NiF_4$-type layered perovskite structure can be obtained by controlling the proportions in the mixture of the target.

In a preferred embodiment, the sputtering is performed by using a target which is a sintered body which is produced by sintering material powders of oxides, carbonates, nitrides or sulfates each containing at least one of La, Ba (or Sr), and Cu which are constituent elements of the resultant superconducting film having the $K_2NiF_4$type oxide.

The $K_2NiF_4$-type compound oxide can be formed into a film, since these oxides, carbonates, nitride and sulfates are relatively stable.

According to a preferred embodiment, the sintered body is made from powders of $La_2O_3$, $BaCO_3$ (or $SrCO_3$) and CuO having such proportions as 70 to 95% by weight of $La_2CO_3$, 1 to 20% by weight of $BaCO_3$ or $SrCo_3$, and 1 to 30% by weight of CuO.

Now, we will describe how to control proportions of components in the thin film.

Table 1. shows melting points of the abovementioned powder:

TABLE 1

| Material | Melting point |
|---|---|
| $La_2O_3$ | 2,307° C. |
| $BaCO_3$ | 1,740° C. |
| $SrCO_3$ | 1,497° C. |

TABLE 1-continued

| Material | Melting point |
|---|---|
| CuO | 1,326° C. |

It is apparent from Table 1 that $La_2O_3$ has a higher melting point than the others and hence is considered to be vaporized at a lower speed than the others during the sputtering. This means that the desired proportions of elements in the thin film cannot be obtained if the sintered body does not have proper proportions of the elements. According to the present invention, the target consisting of a molded and sintered body contains an amount of $La_2O_3$ which is larger than the desired stoichiometrical proportion in the thin film. Namely, according to a preferred embodiment, the target is composed of a sintered body produced from a mixture of 70 to 90% by weight of $La_2O_3$, 1 to 20% by weight of $BaCO_3$ (or $SrCO_3$) and 1 to 30% by weight of CuO.

When the target is a mixture of $La_2CO_3$, $BaCO_3$ and CuO is used, a thin film of $[La_{1-x}, Ba_x]_2CuO_{4-y}$ is obtained, while when the target is a mixture of $La_2CO_3$, $SrCO_3$, and CuO is used, a thin film of $[La_{1-x}, Sr_x]_2CuO_{4-y}$ is obtained. The higher critical temperature is expected in a range of $0.025 \leq x \leq 0.125$ for $[La_{1-x}, Ba_x]_2CuO_{4-y}$ and in a range of $0.09 \leq x \leq 0.25$ for $[La_{1-x}, Sr_x]_2CuO_{4-y}$ respectively.

The composition of the thin film is not influenced much by the existence of the abovementioned non-reacted portions in the target but is rather influenced greatly by the proportion of powders in the mixture. In the industrial scale, the powder sintering is preferably carried out by hot pressing, a hot isostatic pressing, or the like.

According to another aspect of the present invention, the sputtering is preferably conducted in an atmosphere of oxygen gas in the presence of argon gas. The partial pressure of the oxygen gas is preferably adjusted to a range between $10^{-6}$ and $5 \times 10^{-2}$ Torr, more preferably between $10^{-6}$ and $10^{-2}$ Torr.

According to still another aspect of the present invention, the substrate on which the thin film is deposited is preferably heated to a temperature between 100° and 1,200° C. during sputtering. Also, a bias voltage of less than 500 V is preferably impressed onto the substrate during sputtering operation to attract ionized oxygen towards the substrate.

According to still another aspect of the present invention, the deposited thin film is preferably heat-treated at a temperature between 600° and 1,200° C. after the sputtering is completed.

In the case of $K_2NiF_4$-type oxides according to the present invention, it is important that oxygen atoms are orderly contained among the other constituent atoms. Therefore, according to a preferred embodiment, the partial pressure of oxygen is adjusted between $10^{-6}$ and $5 \times 10^{-2}$ Torr, more preferably between $10^{-6}$ and $10^{-2}$ Torr, during the sputtering in order to rationalize the amount of oxygen in the resultant superconducting thin film. If the partial pressure is lower than $10^{-6}$ Torr, no effect of addition of oxygen is obtained because substantially no oxygen exist in the atmosphere. However, if the partial pressure of oxygen exceeds $5 \times 10^{-2}$ Torr, sputtering cannot be practiced since the vacuum pressure is too high. Therefore, the partial pressure of oxygen must be within the range between $10^{-6}$ and $5 \times 10^{-2}$ Torr, more preferably $10^{-6}$ Torr and $10^{-2}$ Torr. The sputtering may be high-frequency sputtering or DC sputtering, but high-frequency sputtering is preferable. In special cases, the thin film may be produced by the ion-plating technique.

In the case of high-frequency sputtering, the applied high-frequency power varies according to the sputtering apparatus used but is preferably lower than 5,000 W. In fact, if the power exceeds 5,000 W, excess energy is given to the ions in the vacuum, which adversely results in an increase of impurities produced from the walls of the chamber.

It is also possible to bias the substrate at a voltage between 0 V and 500 V, more preferably between 10 V and 500 V, so that ionized oxygen are accelerated towards the substrate. Higher voltages which exceed 500 V should not be used because abnormal discharge due to DC voltage will be produced and because too many ions strike the thin film, resulting in a great number of defects will be produced in the film and hence the film will be deteriorated.

Further, when the temperature of the substrate is not higher than 100° C., the thin film becomes amorphous and does not exhibit superconducitivity. To the contrary, if the substrate is heated to a temperature higher than 1,200° C., it is difficult to adjust the proportions of elements in the film. Therefore, the temperature of the substrate is preferably within the range of from 100° C. to 1,200° C. in air.

It is effective to heat the resulting superconducting thin film obtained by the abovementioned film forming process to a temperature between 600° and 1,200° C. in air in order to improve the superconductivity.

The resulting superconducting thin films obtained according to the abovementioned process shows far higher superconducting critical temperatures than existing superconducting films and hence superconducting transitions can be realized without using liquified helium.

Now, the process according to the present invention will be described with reference to illustrative Examples, but the scope of the present invention should not be limited thereto.

EXAMPLE 1—PREPARATION of [La, Sr]$_2$CuO$_4$ THIN FILM—

Figure 2:
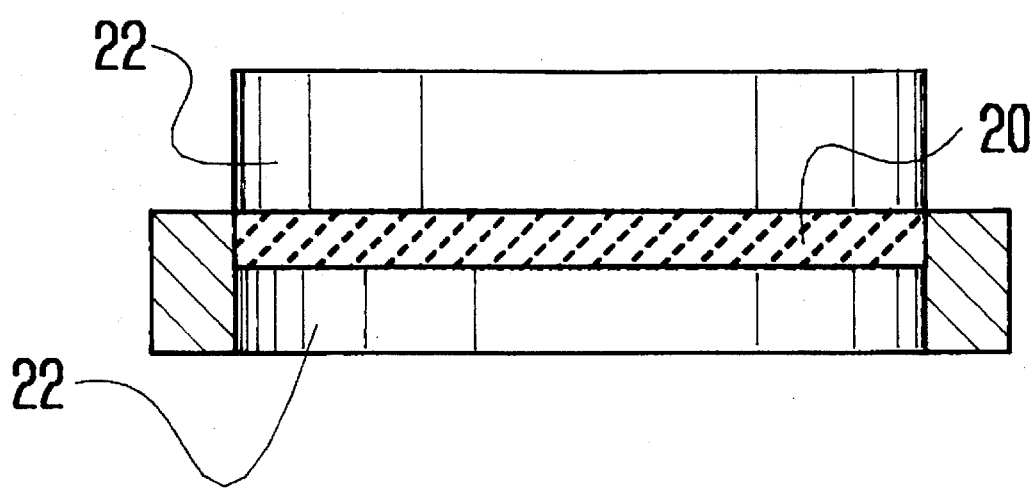
FIG. 2 shows an illustrative cross section of an embodiment of a mold used for powder molding.
Figure 3:
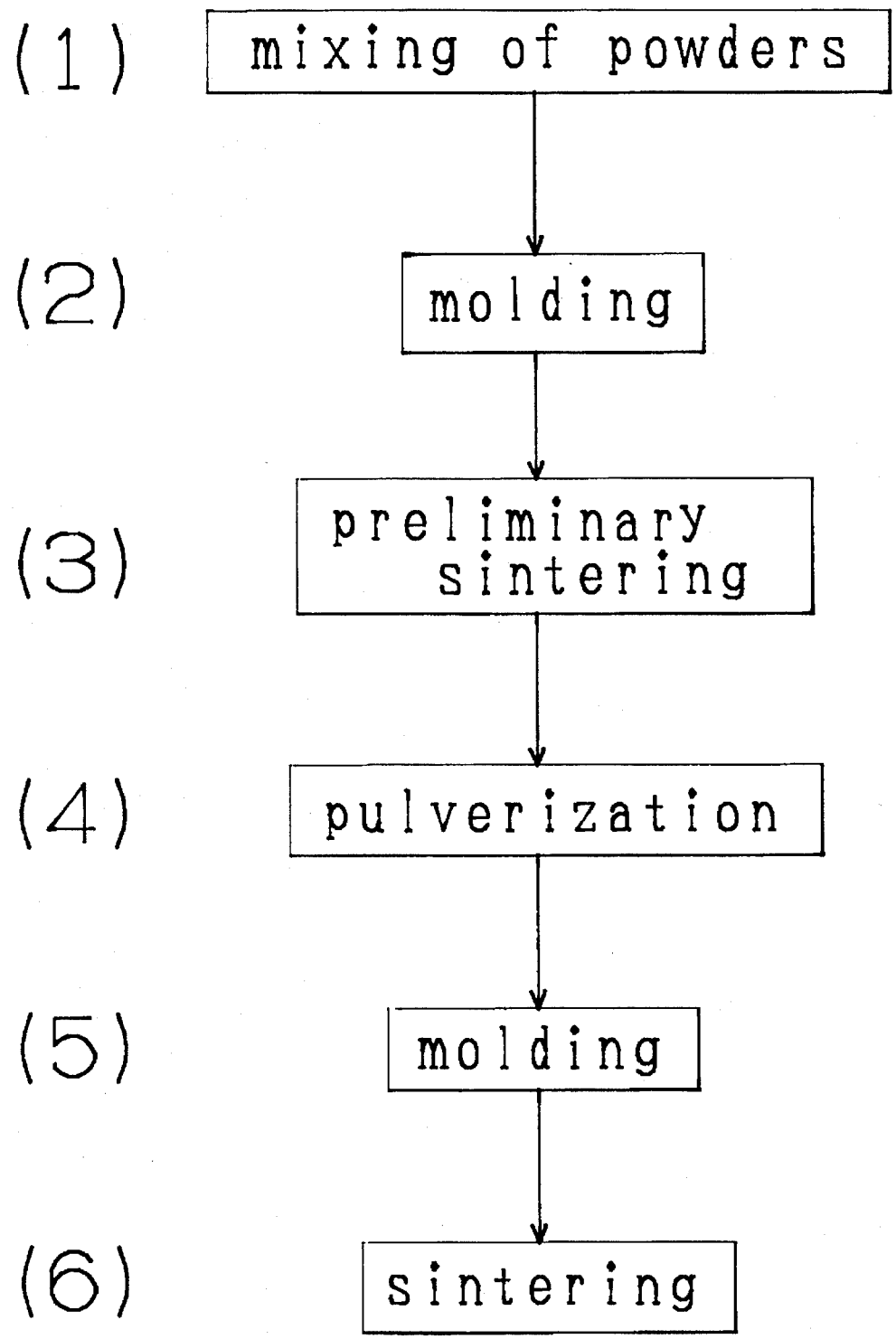
FIG. 3 shows an example of manufacturing steps used in the powder molding technique.

Powders of La$_2$O$_3$, SrCO$_3$ and CuO are mixed uniformly in the proportion of 1.66 : 0.34 : 1 to prepare a target. Then, the powder mixture is subjected to a preliminary sintering at 900° C. for 12 hours in a mold shown in FIG. 2 in which 20 denotes the powders for the target and 22 denotes the mold.

The resulting molded article removed from the mold is very fragile and is pulverized again. The resulting pulverized powder is subjected to a final sintering at 1,100° C. for 2 hours.

A sintered body obtained by the procedure abovementioned as a target is placed in the sputtering apparatus shown in FIG. 1. Sputtering is performed under such conditions that a surface of the substrate is maintained at a temperature of 200° C. and a high-frequency voltage of 1 KV is applied to the substrate.

The resulting thin film is confirmed to be a crystalline film having K$_2$NiF$_4$-type layered perovskite structure by electron probe microanalysis (EPMA).

After the thin film is annealed at 900° C. the transition temperature or the critical temperature is found to be higher than 30K.

It is impossible to obtain a thin film consisting of a compound of [La$_{1-x}$, Sr$_x$]$_2$CuO$_{4-y}$ and having higher transition temperatures when the value of x does not fall within the range of $0.09 \leq x \leq 0.25$.

EXAMPLE 2— PREPARATION OF [La, Ba]$_2$CuO$_4$ THIN FILM—

[La, Ba]$_2$CuO$_4$ thin film is produced in a high-frequency sputtering machine illustrated in FIG. 1.

The target material is a sintered body made from a powder mixture of La$_2$O$_3$, BaCO$_3$ and CuO, while the substrate 4 is a silicon crystal. The film is produced under the following conditions:

Partial pressure of Ar as sputtering gas: $10^{-3}$ Torr
Partial pressure of oxygen=$10^{-4}$ Torr
Temperature of the substrate: 900° C.
High-frequency power impressed to the target: 500 W
Substrate bias voltage: 50 V A thickness of about 1 μm is obtained at a film-forming speed of 10 A/sec. As a comparative example, the same procedure is repeated except that oxygen is not supplied.

Figure 4:
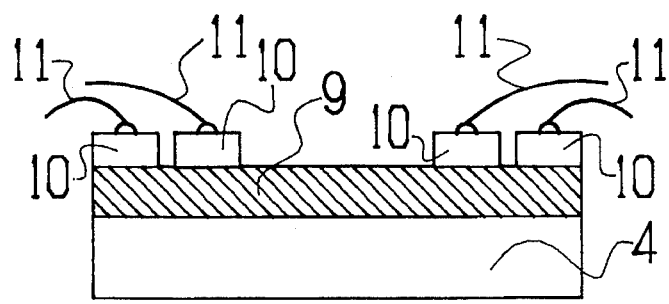
FIG. 4 is an illustration of a test sample for determining the temperature dependency of the superconducting thin film produced according to the present invention.

A sample shown in FIG. 4 is prepared from each resulting substrate having a thin film thereon in order to determine the resistance of the thin film. The sample for resistance measurement shown in FIG. 4 comprises the substrate 4, a thin film 9 of [La, Ba]$_2$CuO$_4$ deposited on the substrate, and two pairs of electrodes 10 made of aluminum which are vacuum-deposited on a surface of the thin film 9. Two pairs of lead wires 11 are soldered to the aluminum electrodes 10 respectively.

Figure 5:
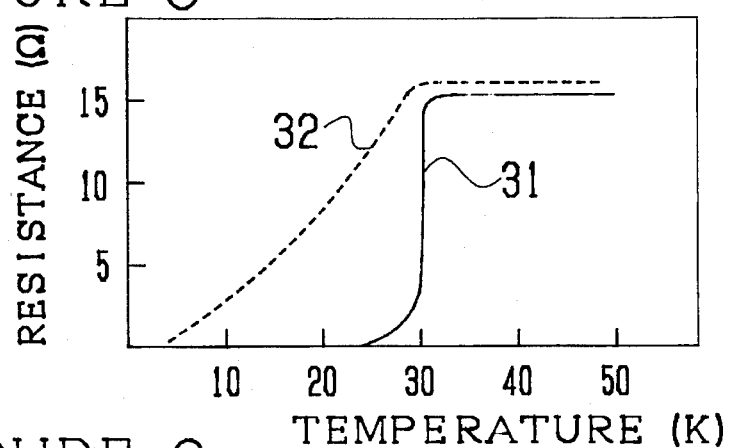
FIG. 5 is a graph showing the temperature dependency of resistance of $[La, Ba]_2CuO_4$ thin films produced according to Example 1 of the process of the present invention and according to a comparative example, respectively.

FIG. 5 shows the temperature dependency of resistance of the thin films measured on Example 1 and its comparative example. In FIG. 5, the curve expressed by the solid line having a reference number 31 shows the temperature dependency of the resistance of the thin film which is produced in a bell jar containing oxygen whose partial pressure is $10^{-4}$ Torr, while the curve shown by the dashed line having a reference number 32 shows that of another thin film which is produced in the bell jar into which oxygen is not fed.

It is apparent from the curve of resistance 31 that the thin film produced according to the process of the present invention shows an onset temperature when the phenomenon of superconductivity starts is about 30 K and complete superconductivity is observed below 25 K, while the curve of resistance 32 shows zero-resistance only below several K and has a rather gentle slope although the resistance starts to drop from nearly same temperature as for the above case. Comparison between these two curves reveals that introduction of oxygen gas into the bell jar during the film deposition permits control or adjustment of the oxygen content in the thin film to obtain a superconductive thin film having a desired composition.

EXAMPLE 3

—preparation of a thin film of [La, Sr]$_2$CuO$_4$—

The same procedure as in Example 2 for [La, Ba]$_2$CuO$_4$ is repeated. As target material, a sintered body produced from a powder mixture of La$_2$O$_3$, SrCO$_3$, and CuO is used. Films are deposited by using two different targets each consisting of a sintered body produced from a powder mixture containing 20% and 60% by weight of CuO, respectively.

Figure 6:
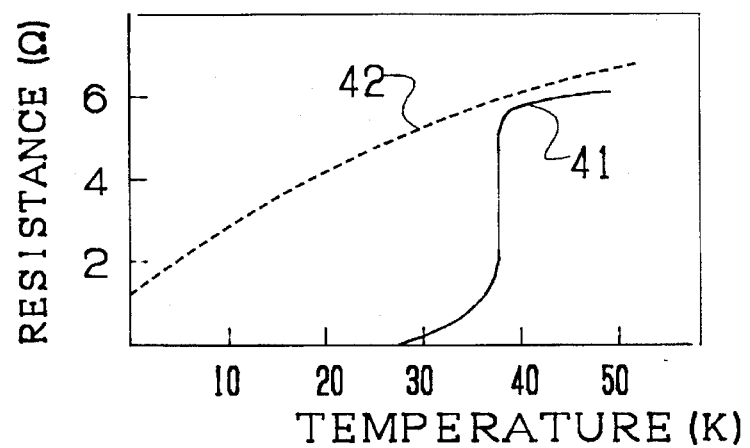
FIG. 6 is a graph showing the temperature dependency of resistance of $[La, Sr]_2CuO_4$ thin films produced according to Example 2 of the process of the present invention and according to a comparative example, respectively.

The film is deposited under the following conditions:

Partial pressure of Ar as sputtering gas: $10^{-3}$ Torr
Partial pressure of oxygen: $10^{-4}$ Torr
Temperature of the substrate: 900° C.
High-frequency power applied to the target: 500 W
Substrate bias voltage: 50 V FIG. 6 shows the temperature dependency of resistance of the resulting thin films, wherein the curve expressed by the solid line having a reference number 41 illustrates the curve of resistance of a thin film produced by the first target containing 20% by weight of CuO, while the curve expressed by the dashed line having a reference number 42 illustrates that of another thin film produced by the second target containing 60% by weight of CuO.

It is apparent from the curve 42 that the thin film produced from the second target containing 60% by weight of CuO does not show superconductivity, while the thin film produced from the first target containing 20% by weight of CuO according to the present invention shows an onset temperature of about 38 K and complete superconductivity is observed below 27 K. Thus, the film corresponding to the curve of resistance 41 shows improved properties as a superconductor.

What we claim are:

1. A process for preparing a superconducting thin film on a substrate, comprising the steps of:
   (a) forming a target of a particular material comprising oxygen, copper, lanthanum, and strontium or barium;
   (b) sputtering said particular material from said target onto a substrate to form a superconductive thin film on said substrate, said sputtering step including the steps of
      (i) supplying additional oxygen from an oxygen supply to said thin film during said sputtering step, said additional oxygen being in addition to said oxygen available from said particular material and being in an effective amount to form said thin film as a compound oxide which is superconductive, and
      (ii) controlling heating of said substrate during said sputtering step by applying heat to said substrate from an adjustable heat source distinct from said substrate, distinct from said target and distinct from said oxygen supply to control said substrate at an effective temperature of about 900° C. to cause said compound oxide to be superconductive,
   said sputtering step producing said compound oxide having a composition
   $(La_{1-x}M_x)_2CuO_{4-y}$
   wherein,
   M is Sr or Ba,
   $0<x<1$,
   $0\leq y<4$,
   said compound oxide having a crystal structure similar to that of $K_2NiF_4$-type oxides; and
   (c) heat treating said compound oxide, after said sputtering step, at an effective temperature and for an effective duration to cause said compound to become superconductive at a $T_c$ of 25°–38° K.

2. The process of claim 1, wherein said forming step comprises the steps of:
   producing a mixture comprising a compound of Cu, a compound of La and a compound of Sr or a compound of Ba, and
   sintering said mixture to form said target.

3. The process of claim 2, wherein said producing step comprises the steps of:
   using CuO as said compound of Cu,
   using $La_2CO_3$ as said compound of La, and
   using $SrCO_3$ as said compound of Sr or
   using $BaCO_3$ as said compound of Ba.

4. The process of claim 3, wherein said producing step further comprises the step of using said CuO as 20–30% by weight of said mixture.

5. The process of claim 1, wherein said sputtering step further comprises the step of applying an effective value of negative bias to said substrate, during said sputtering step, to attract oxygen ions of said additional oxygen in said effective amount to form said compound oxide which is superconductive.

6. The process of claim 5, wherein said effective value of negative bias is 10–500V.

7. The process of claim 6, wherein said effective value of negative bias is 50V.

8. A process for preparing a superconducting thin film on a substrate, consisting essentially of the steps of:
   (a) forming a target of a particular material comprising oxygen,, copper, lanthanum, and strontium or barium;
   (b) sputtering said particular material from said target onto a substrate selected from the group consisting of single crystals of magnesia, strontium, titanate, beryllia, alumina, silicon and yttrium stabilized zirconia to form a superconductive thin film on said substrate, said sputtering step including the steps of
      (i) supplying additional oxygen from an oxygen supply to said thin film during said sputtering step, said additional oxygen being in addition to said oxygen available from said particular material and being in an effective amount to form said thin film as a compound oxide which is superconductive, and
      (ii) controlling heating of said substrate during said sputtering step by applying heat to said substrate from an adjustable heat source distinct from said substrate, distinct from said target and distinct from said oxygen supply to control said substrate at an effective temperature of about 900° C. to cause said compound oxide to be superconductive,
   said sputtering step producing said compound oxide having a composition
   $(La_{1-x}M_xM_x)_2CuO_{4-y}$
   wherein,
   M is Sr or Ba,
   $0<x<1$,
   $0\leq y<4$,
   said compound oxide having a crystal structure similar to that of $K_2NiF_4$-type oxides; and
   (c) heat treating said compound oxide, after said sputtering step, at an effective temperature and for an effective duration to cause said compound to become superconductive at a $T_c$ of 25°–38° K.

9. A process for preparing a superconducting thin film on a substrate, consisting essentially of the steps of:
   (a) forming a target of a particular material comprising oxygen, copper, lanthanum, and one of strontium or barium, said target being formed of compounds selected from the group consisting of oxides, carbonates, nitrates and sulfates of copper, lanthanum, and one of strontium or barium;
   (b) sputtering said particular material from said target onto a substrate to form a superconductive thin film on said substrate, said sputtering step including the steps of
      (i) supplying additional oxygen from an oxygen supply to said thin film during said sputtering step, said additional oxygen being in addition to said oxygen available from said particular material and being in an effective amount to form said thin film as a compound oxide which is superconductive, and
      (ii) controlling heating of said substrate during said sputtering step by applying heat to said substrate from an adjustable heat source distinct from said substrate, distinct from said target and distinct from said oxygen supply to control said substrate at an effective temperature of about 900° C. to cause said compound oxide to be superconductive,
said sputtering step producing said compound oxide having a composition $(La_{1-x}M_x)_2CuO_{4-y}$ wherein, M is Sr or Ba, $0 < x < 1$, $0 \leq y < 4$, said compound oxide having a crystal structure similar to that of $K_2NiF_4$-type oxides; and (c) heat treating said compound oxide, after said sputtering step, at a temperature of 600° to 1200° C. for a period of time effective to cause said compound to become superconductive at a $T_c$ of 25°–38° K.

* * * * *